US008941815B2

(12) United States Patent
Lafarre et al.

(10) Patent No.: US 8,941,815 B2
(45) Date of Patent: Jan. 27, 2015

(54) SUBSTRATE TABLE FOR A LITHOGRAPHIC APPARATUS, LITHOGRAPHIC APPARATUS, METHOD OF USING A SUBSTRATE TABLE AND DEVICE MANUFACTURING METHOD

(75) Inventors: Raymond Wilhelmus Louis Lafarre, Helmond (NL); Jozef Petrus Henricus Benschop, Veldhoven (NL); Nicolaas Ten Kate, Almkerk (NL); Niek Jacobus Johannes Roset, Eindhoven (NL); Gerardus Adrianus Antonius Maria Kusters, Eindhoven (NL); Alexander Nikolov Zdravkov, Eindhoven (NL); Hrishikesh Patel, Eindhoven (NL); Sander Van Opstal, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 400 days.

(21) Appl. No.: 12/821,015

(22) Filed: Jun. 22, 2010

(65) Prior Publication Data
US 2011/0013169 A1    Jan. 20, 2011

Related U.S. Application Data

(60) Provisional application No. 61/213,658, filed on Jun. 30, 2009.

(51) Int. Cl.
*G03B 27/58* (2006.01)
*G03F 7/20* (2006.01)

(52) U.S. Cl.
CPC ........ *G03F 7/70916* (2013.01); *G03F 7/70341* (2013.01); *G03F 7/707* (2013.01); *G03F 7/70808* (2013.01)

USPC .............................................. 355/74; 355/72

(58) Field of Classification Search
USPC .......................................... 355/72, 74, 77, 53
See application file for complete search history.

(56) References Cited

U.S. PATENT DOCUMENTS

| 4,509,852 | A | 4/1985 | Tabarelli et al. ................ 355/30 |
| 4,742,797 | A | 5/1988 | Barker |
| 6,461,155 | B1 | 10/2002 | Settles |
| 6,680,774 | B1 | 1/2004 | Heinle |
| 6,952,253 | B2 | 10/2005 | Lof et al. ........................ 355/30 |
| 7,193,232 | B2 | 3/2007 | Lof et al. ....................... 250/548 |
| 7,199,858 | B2 | 4/2007 | Lof et al. |
| 7,213,963 | B2 | 5/2007 | Lof et al. |
| 7,501,226 | B2 | 3/2009 | Lin et al. ....................... 430/311 |
| 7,517,639 | B2 | 4/2009 | Lin et al. ....................... 430/311 |
| 8,125,611 | B2* | 2/2012 | Chang et al. ..................... 355/30 |
| 2004/0160582 | A1* | 8/2004 | Lof et al. ........................ 355/30 |
| 2005/0122505 | A1 | 6/2005 | Miyajima |
| 2005/0286033 | A1 | 12/2005 | Lin et al. |
| 2006/0139614 | A1 | 6/2006 | Owa et al. |

(Continued)

FOREIGN PATENT DOCUMENTS

| EP | 1 420 298 | 5/2004 |
| EP | 1 420 300 | 5/2004 |

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A cover is provided for a substrate table in an immersion lithographic apparatus that covers at least the gap between a substrate and a recess in a substrate table in which the substrate is received.

21 Claims, 11 Drawing Sheets

(56) References Cited

U.S. PATENT DOCUMENTS

| | | |
|---|---|---|
| 2007/0008508 A1 | 1/2007 | Lin et al. |
| 2007/0115450 A1 | 5/2007 | Nagasaka et al. |
| 2007/0188731 A1 | 8/2007 | Bezama et al. ............... 355/72 |
| 2007/0229786 A1 | 10/2007 | Kemper et al. |
| 2007/0258076 A1* | 11/2007 | Derksen et al. ............... 355/67 |
| 2008/0106715 A1 | 5/2008 | Lin et al. ..................... 355/53 |
| 2008/0165331 A1 | 7/2008 | Jacobs et al. ................ 355/30 |
| 2008/0186460 A1 | 8/2008 | Auer-Jongepier et al. .... 355/30 |
| 2008/0297748 A1* | 12/2008 | Smeets et al. ................ 355/53 |
| 2009/0206304 A1 | 8/2009 | Dziomkina ................... 252/589 |
| 2011/0228238 A1* | 9/2011 | Roset et al. .................. 355/30 |
| 2011/0228248 A1* | 9/2011 | Lafarre et al. ................ 355/72 |
| 2011/0285976 A1* | 11/2011 | Roset et al. .................. 355/30 |
| 2011/0292369 A1* | 12/2011 | Lafarre et al. ................ 355/72 |

FOREIGN PATENT DOCUMENTS

| | | |
|---|---|---|
| EP | 1 429 188 | 6/2004 |
| EP | 1 821 150 | 8/2007 |
| JP | 2005-005707 | 1/2005 |
| JP | 2005-191557 | 7/2005 |
| JP | 2006-120889 | 5/2006 |
| JP | 2006-173527 | 6/2006 |
| JP | 2006-202825 | 8/2006 |
| JP | 2007-142168 | 6/2007 |
| JP | 2007-158343 | 6/2007 |
| JP | 2007-208279 | 8/2007 |
| JP | 2008-153652 | 7/2008 |
| WO | WO 99/49504 | 9/1999 |
| WO | WO 2005/064405 | 7/2005 |

* cited by examiner

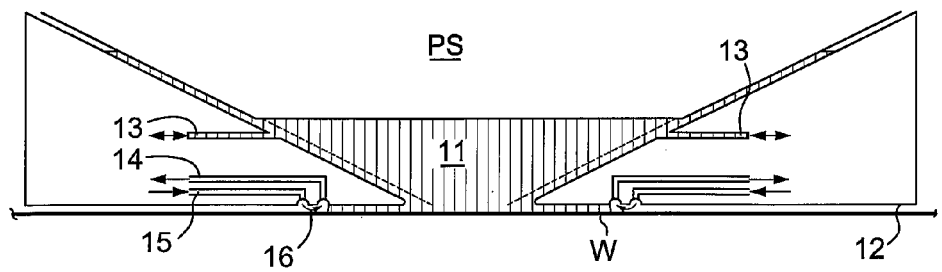
Fig. 5
Fig. 6
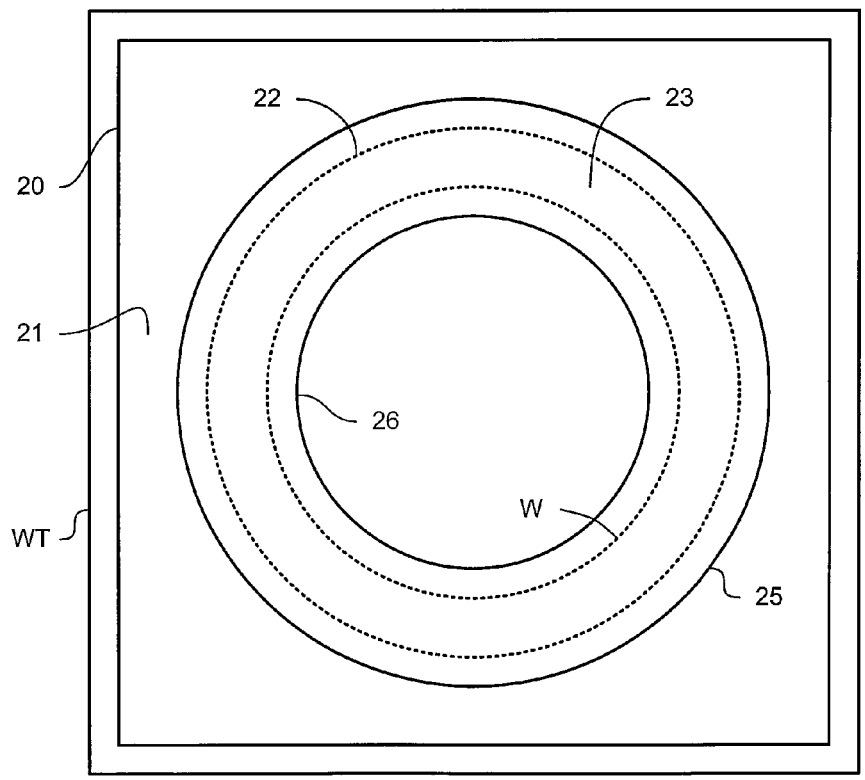

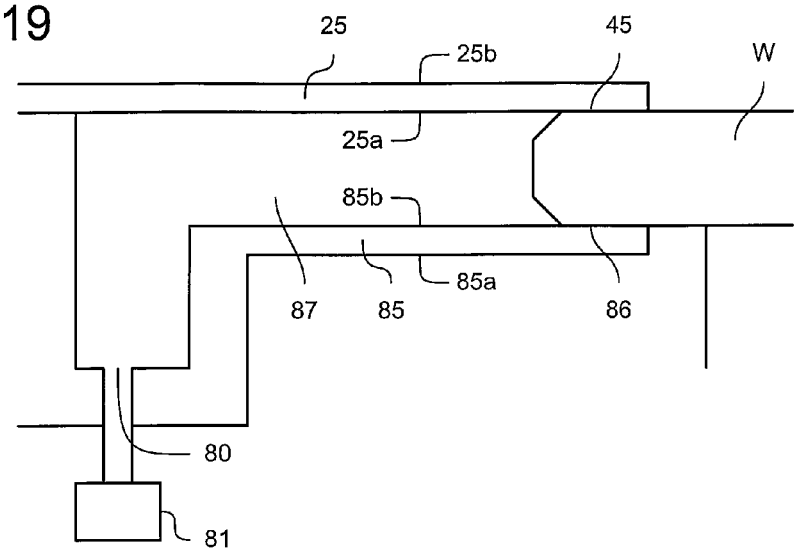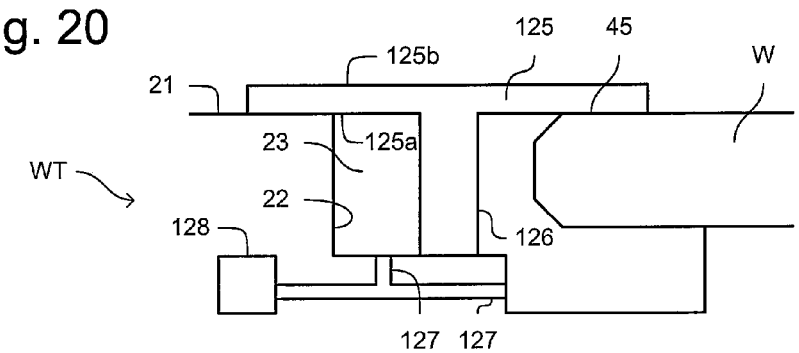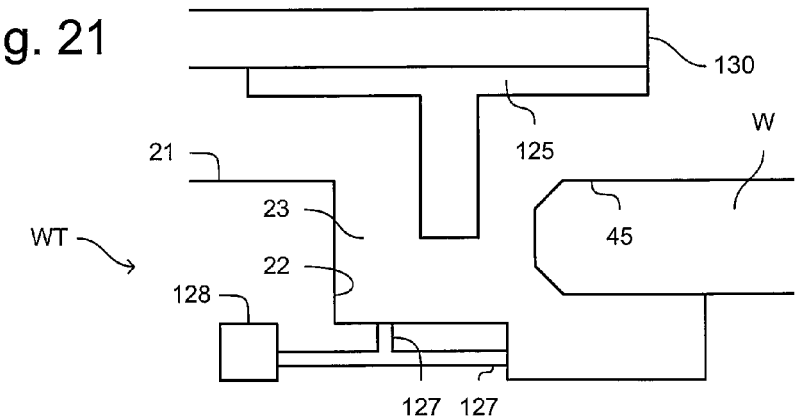

SUBSTRATE TABLE FOR A LITHOGRAPHIC APPARATUS, LITHOGRAPHIC APPARATUS, METHOD OF USING A SUBSTRATE TABLE AND DEVICE MANUFACTURING METHOD

This application claims priority and benefit under 35 U.S.C. §119(e) to U.S. Provisional Patent Application No. 61/213,658, entitled "Substrate Table for a Lithographic Apparatus, Lithographic Apparatus, Method of Using a Substrate Table and Device Manufacturing Method", filed on Jun. 30, 2009. The content of that application is incorporated herein in its entirety by reference.

FIELD

The present invention relates to a substrate table for a lithographic apparatus, a lithographic apparatus, a method of using a substrate table and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another liquid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

Other arrangements which have been proposed include a confined immersion system and an all wet immersion system. In a confined immersion system a liquid supply system provides liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504.

In an all wet immersion system, as disclosed in PCT patent application publication WO 2005/064405 the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. Liquid is allowed to leak over the remainder of the substrate. A barrier at the edge of a substrate table prevents the liquid from escaping so that it can be removed from the top surface of the substrate table in a controlled way.

The immersion system may be a fluid handling system or apparatus. In an immersion system, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. The fluid handling system may be located between the projection system and the substrate table. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In a fluid handling system or liquid confinement structure, liquid is confined to a space, for example within a confinement structure. The space may be defined by the body of the confinement structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

SUMMARY

In a lithographic apparatus, a substrate is supported on a substrate table by a substrate holder. The substrate holder may be located in a recess of the substrate table. The recess may be dimensioned so that when a substrate is supported by the substrate holder the top surface of the substrate is generally in the same plane as the surface of the substrate table surrounding the substrate. Around the substrate, there may be a gap between an edge of a substrate and an edge of the substrate table. Such a gap may be undesirable in an immersion system of a lithographic apparatus. As the gap moves under the immersion liquid in the space between the final element of the projection system and the underlying surface, the meniscus between the confinement structure and the underlying surface crosses the gap. Crossing the gap may increase the instability of the meniscus. The stability of the meniscus may decrease with increased relative speed, e.g. scanning or stepping speed, between the confinement structure and the substrate table. An increasingly unstable meniscus is a risk to increased defectivity. For example an unstable meniscus may enclose gas as a bubble in the immersion liquid, or allow a droplet to escape from the immersion space. Such a bubble may be drawn into the space and result in imaging defects. A droplet may be a source of contaminants and a heat load as it evaporates and it may later collide with the meniscus causing a bubble to be drawn in to the space.

One or more problems of crossing the gap may be reduced by the provision of a two-phase extraction system. The two phase extraction system extracts fluid such as immersion liquid and gas (which may be present as a bubble in the liquid) from the gap. Sources of defectivity may be reduced if not eliminated, such as releasing a bubble into the space or a droplet escaping from the space. However, the provision of such an extraction system may impart a heat load on the substrate table and the substrate. This may have a negative impact on the overlay accuracy of patterns formed on the substrate. The gap may implicitly limit the scan speed that may be used to achieve reliable imaging of a substrate.

It is therefore desirable, for example, to provide a system to increase the stability of the meniscus and reduce defectivity, for example the likelihood of creating a bubble or releasing a droplet.

In an aspect, there is provided a substrate table for a lithographic apparatus, the substrate table having a substantially planar upper surface in which is formed a recess that is configured to receive and support a substrate, the substrate table comprising:

a cover, configured such that, in use, it extends around the substrate from the upper surface to a peripheral section of an upper major face of the substrate in order to cover a gap between an edge of the recess and an edge of the substrate and such that it defines an open central section of the cover; and an actuator system configured to move the cover between a closed position, in which the cover is in contact with the upper surface of a substrate supported in the recess, and an open position, in which the cover is set apart from a substrate in the recess, wherein the actuator system is configured such that, in moving the cover to the open position, it enlarges the open central section of the cover sufficiently for the substrate to be able to pass through the open central section of the cover.

In an aspect, there is provided a lithographic apparatus comprising a substrate table as above.

In an aspect, there is provided a method of loading a substrate onto, or unloading a substrate from, a substrate table of a lithographic apparatus comprising:

a substrate table, having a substantially planar upper surface and a recess within said upper surface that is configured to receive and support the substrate; and a cover, configured such that, in use, it extends around the substrate from the upper surface of the substrate table to a peripheral section of an upper major face of the substrate in order to cover a gap between an edge of the recess and an edge of the substrate and such that it defines an open central section of the cover;

wherein the method comprises moving the cover between a closed position, in which the cover is in contact with the upper surface of the substrate supported in the recess, and an open position, in which the cover is set apart from the substrate in the recess; and wherein, in moving the cover to the open position, the open central section of the cover is enlarged sufficiently for the substrate to pass through the open central section of the cover.

In an aspect, there is provided a method of loading a substrate onto a substrate table of a lithographic apparatus, the method comprising:

placing a substrate in a recess formed in an upper surface of a substrate table, the recess configured to receive a substrate; and moving a cover to a closed position, in which the cover is in contact with the upper surface of the substrate supported in the recess, from an open position, in which the cover is set apart from the substrate, the cover configured such that, when a substrate is present in the recess, in the closed position the cover extends around the substrate, from the upper surface of the substrate table to a peripheral section of an upper surface of the substrate, the cover having an open central section.

In an aspect, there is provided a method of unloading a substrate from, a substrate table of a lithographic apparatus, the method comprising:

moving a cover:
  from a closed position, in which the cover is in contact with
    an upper surface of a substrate supported in a recess
    formed in an upper surface of a substrate table, the cover
    configured such it extends around the substrate from the
    upper surface of the substrate table to a peripheral section of an upper major face of the substrate, the cover
    defining an open central portion;
  to an open position, in which the cover is set apart from the
    substrate, so that the open central portion of the cover is
    enlarged sufficiently for the substrate to pass through the
    open central section; and
removing the substrate from the substrate table.

In an aspect, there is provided a device manufacturing method comprising loading a substrate onto and/or unloading a substrate from a lithographic apparatus as above.

In an aspect, there is provided a substrate table for a lithographic apparatus, the substrate table configured to support a substrate in a recess formed in a planar surface of the substrate table, the recess dimensioned to have a gap between a substrate supported by the substrate table and an edge of the recess, the substrate table having a closing arrangement configured to close the gap, the arrangement comprising:

a planar closing element shaped and dimensioned to close the gap between an edge of a substrate and the edge of the recess; and an actuator configured to move the planar closing element from an open position in which a substrate can be placed in the recess and a closed position in which the planar closing element closes the gap, wherein in moving the closing element into the closed position, the actuator is configured to move the closing element in a direction substantially perpendicular to the surface of the substrate to close the gap.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a liquid confinement structure which may be used in an embodiment of the invention as a liquid supply system;

FIG. 6 depicts, in plan view, a substrate receiving section according to an aspect of the invention;

FIG. 19 depicts, in cross-section, an arrangement of a cover according to an aspect of the invention;

FIGS. 20 and 21 depict, in cross-section, a cover according to an aspect of the invention;

DETAILED DESCRIPTION

Figure 1:
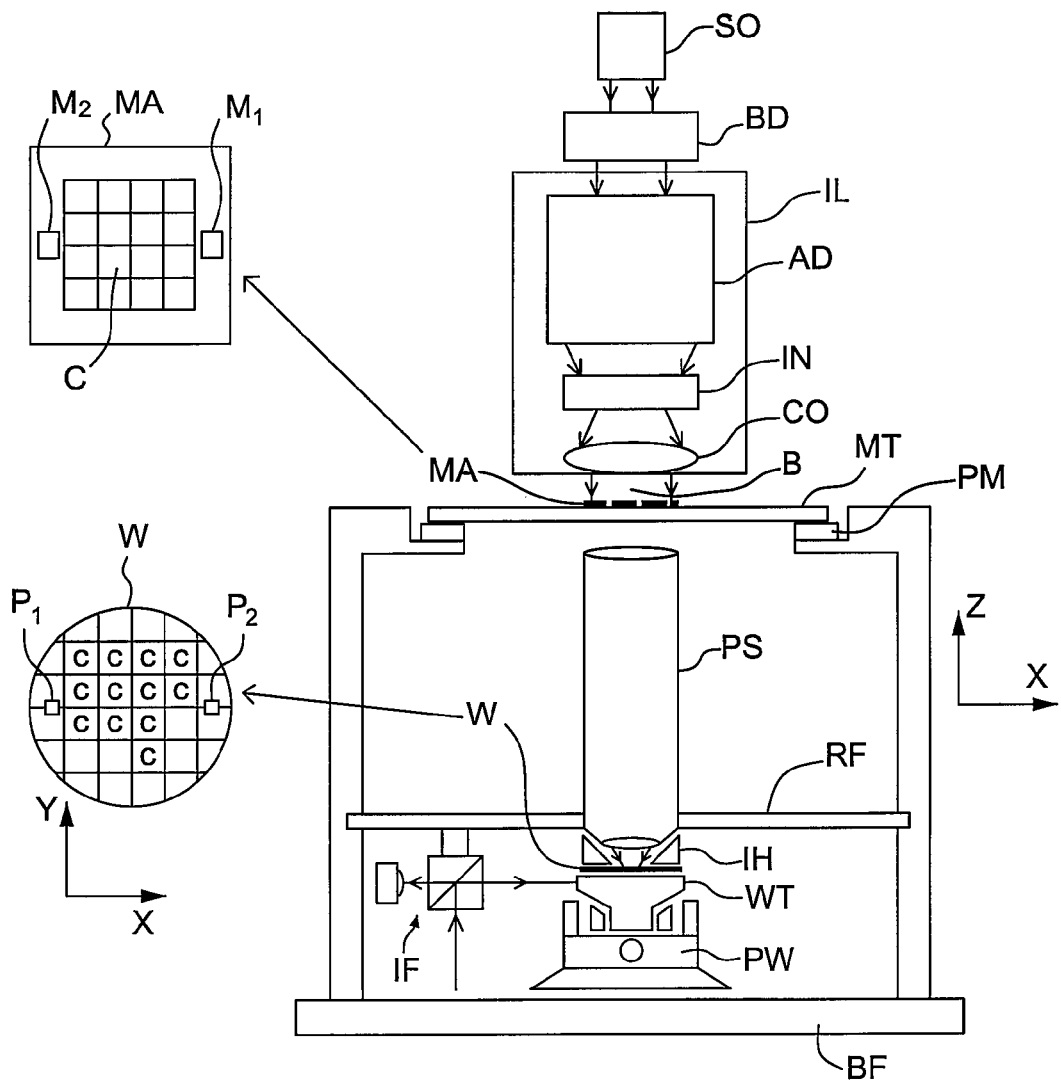
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device. MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a' radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system H. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5.

Figure 2:
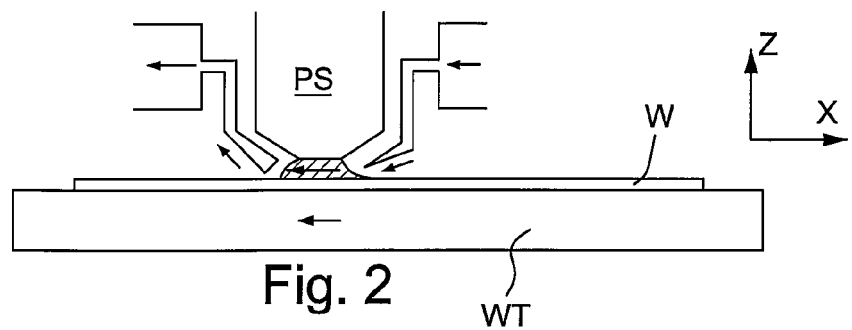
FIGS. 2 and 3 depict a fluid handling structure as a liquid supply system for use in a lithographic projection apparatus.
Figure 3:
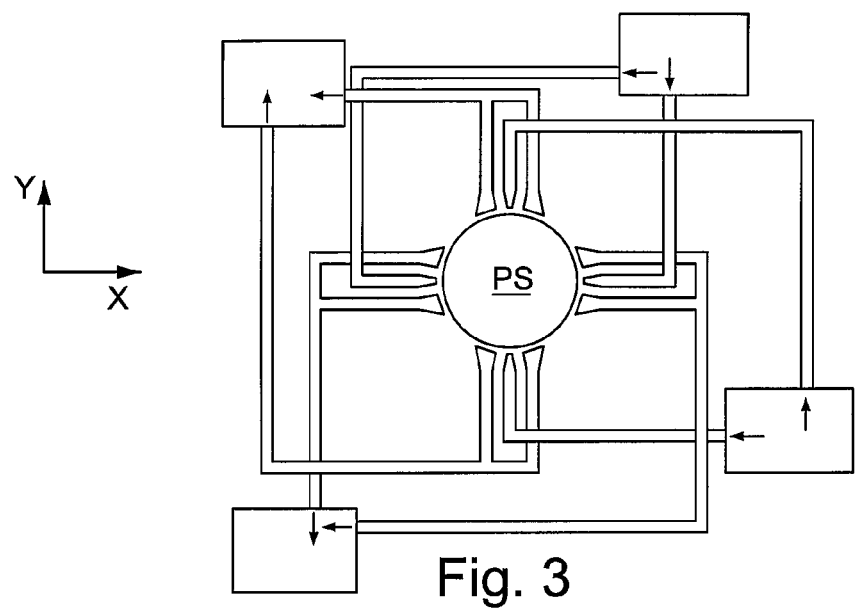

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
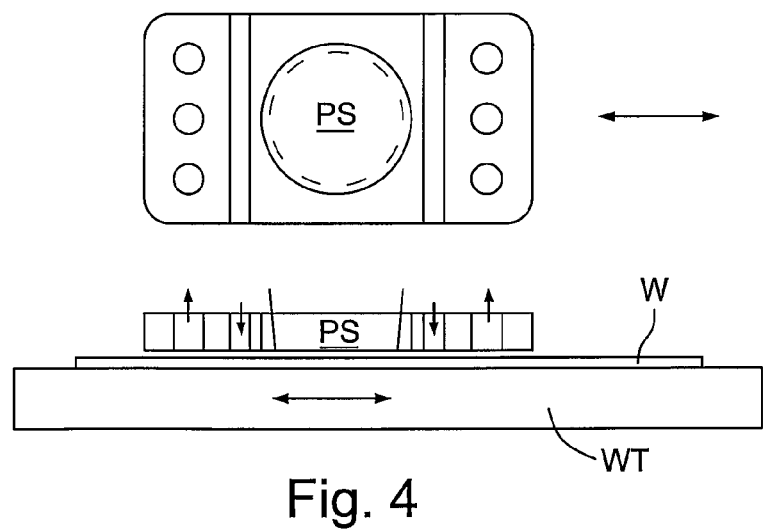
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of the liquid is shown by arrows in FIG. 4.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, hereby incorporated in its entirety by reference.

FIG. 5 schematically depicts a localized liquid supply system with a liquid confinement structure 12. The liquid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as fluid seal, desirably a gas seal.

The liquid confinement structure 12 at least partly contains liquid in the immersion space 11 between a final element of the projection system PS and the substrate W. A contactless seal 16 to the substrate W may be formed around the image field of the projection system PS so that liquid is confined within the space 11 between the substrate W surface and the final element of the projection system PS. The immersion space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the liquid confinement structure 12 and the surface of the substrate W. Other types of seal are possible, as is no seal (for example in an all wet embodiment) or a seal achieved by capillary forces between the undersurface of the liquid confinement structure 12 and a facing surface, such as the surface of a substrate W, a substrate table WT or a combination of both.

The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Other arrangements are possible and, as will be clear from the description below, an embodiment of the invention may use any type of localized immersion system.

In a localized immersion system a seal is formed between a part of the liquid confinement structure and a surface of a substrate W. The seal may be defined by a meniscus of liquid between the liquid confinement structure and a surface facing the liquid confinement structure, such as the substrate W. Relative movement between the facing surface (e.g. the substrate W and the substrate table) and the liquid confinement structure may lead to breakdown of the seal, for example the meniscus, above a critical speed. Above the critical speed, the seal may break down allowing liquid, e.g. in the form of a droplet, to escape from the liquid confinement structure, or gas, i.e. in the form of a bubble, to be enclosed in the immersion liquid within the immersion space.

A droplet may be a source of defectivity. The droplet may apply a thermal load on the surface which it is located as it evaporates. The droplet may be a source of contamination, in leaving a drying stain after it has evaporated. If the droplet lies in the path on the underlying surface which moves under the projection system, the droplet may contact the meniscus. The resulting collision between the meniscus and the droplet may cause a bubble to form in the liquid. A bubble may be a source of defectivity. A bubble in the immersion liquid may be drawn in to the space between the projection system and the substrate where it may interfere with an imaging projection beam.

Critical speed may be determined by properties of the underlying surface. The critical speed of a gap relative to the confinement structure may be less than the critical speed for the surface of a relatively planar surface such as a substrate.

On increasing the scan velocity above the lowest critical speed for a part of the undersurface, the scan velocity will exceed the critical speed for more of the underlying surface. The problem may be more significant at high scan velocities. However, an increased scan velocity is desirable because throughput increases.

FIG. 6 depicts, in plan view, a substrate table WT that may be used to support a substrate W. The substrate table may have a substantially planar upper surface 21 of a substrate table structure 20. In the upper surface 21 is a recess 22 that is configured to receive and support a substrate W.

In the recess may be a substrate support which may be a surface of the recess. The surface of the recess 22 may include a plurality of protrusions on which a lower surface of the substrate is supported. The surface of the recess may include a barrier. In the surface of the recess may be formed a plurality of openings. The barrier surrounds the protrusions to define a space beneath the lower surface of the substrate W. The openings are connected to an under-pressure source. When a substrate is located above the openings a space is formed beneath the substrate W. The space may be evacuated by operation of the underpressure. This arrangement may be used in order to secure the substrate W to the substrate table WT.

In an arrangement, the recess may be configured such that the major faces of the substrate, namely the upper face and the lower face, are substantially parallel to the upper surface 21 of the substrate table. In an arrangement, the upper face of the substrate W may be arranged to be substantially coplanar with upper surface 21 of the substrate table.

It should be appreciated that in the present application, terms such as upper and lower may be used in order to define the relative positions of components within the systems described. However, these terms are used for convenience in order to describe the relative positions of the components when the apparatus is used at a particular orientation. They are not intended to specify the orientation in which the apparatus may be used.

As depicted in FIG. 6, a gap 23 may be present between an edge of the substrate W and an edge of the recess 22. A cover 25 is provided that extends around the substrate W. The cover 25 extends from a peripheral section of the upper surface of the substrate W (which in an embodiment may be an edge of the substrate) to the upper surface 21 of the substrate table WT. The cover 25 may entirely cover the gap 23 between the edge of the substrate W and the edge of the recess 22. In addition, an open central section 26 of the cover 25 may be defined by an inner edge of the cover. The open central section 26 may be arranged such that, in use, the cover 25 does not cover portions of the substrate W on which it is intended to project a patterned beam of radiation. The inner edge of the cover may cover portions of the substrate which neighbor the surface of the substrate which is imaged by the patterned projection beam. The cover is located away from those portions of the substrate which are exposed by the patterned projection beam.

As shown in FIG. 6, when the cover 25 is placed on the substrate W, the size of the open central section 26 may be slightly smaller than the size of the upper surface of the substrate W. As shown in FIG. 6, if the substrate W is circular in shape, the cover 25 may be generally annular in shape when viewed in plan view.

The cover 25 may be in the form of a thin cover plate. The cover plate may, for example, be formed from stainless steel. One or more other materials may be used. The cover plate may be coated with Lipocer coating made by Plasma Electronic GmbH. Lipocer is a coating which may be lyophobic (e.g. hydrophobic) and is relatively resistant to damage from exposure radiation and immersion liquid (which may be highly corrosive). More information on Lipocer may be found in U.S. patent application publication no. US 2009/0206304, which is hereby incorporated by reference in its entirety. The cover plate may, for example, be 25 microns thick. It may be etched to be locally reduced in thickness, for example at one or more of the edges. In a locally reduced area it may be 10 microns thick.

In an embodiment, the cover may be a part of the substrate table. An actuator system may be provided to move the cover between at least closed and open positions. In the closed position, the cover 25 may be in contact with the upper surface of a substrate W within the recess 22. In the closed position, the cover 25 may be in contact with the upper surface 21 of the substrate table WT. In the closed position, the cover 25 may cover the gap 23 between the edge of the substrate W and the edge of the recess 22.

The cover 25 may be configured so that, as the gap passes underneath the immersion space 11, with respect to the immersion liquid in the space, the gap is closed. By closing the gap, the stability of the meniscus in crossing the gap may be improved. In an embodiment, the cover forms a seal with one, or both, of the upper surface of a substrate W within the recess 22 and the upper surface 21 of the substrate table WT. A cover 25 that provides a seal with both the upper surface of the substrate W and the upper surface 21 of the substrate table WT may prevent immersion liquid from passing into the gap 23. The cover may reduce the inflow of immersion liquid into the gap 23. The cover may help reduce, if not prevent, the flow of bubbles into the space 11 as a consequence of the gap passing underneath the space 11. In an embodiment, in the closed position the gap is not completely closed but that the gap is covered so that liquid does not enter the gap during operation. In the open position, the gap is opened so the substrate may be placed on or removed from the substrate table. It is not necessary for the gap to be completely closed or completely open, respectively.

In the open position, the cover 25 may be moved away from its location at the first position relative to the surface of the recess. When a substrate is supported by the surface of the recess 22, the cover may be set apart from the substrate W. The open position may be arranged such that, when the cover 25 is in the open position, the substrate W may be unloaded from the substrate table WT. If a substrate is not present in the recess, a substrate W may be loaded onto the substrate table WT.

In an embodiment, the actuator system is configured such that, in moving the cover from the closed position to the open position, it enlarges the open central section 26 of the cover 25. In such a process, the open central section 26 of the cover 25 may be enlarged sufficiently that the open central section 26 is larger than the upper surface of the substrate W in the open position. The open central section 26 of the cover 25 may be enlarged sufficiently for the substrate W to be able to pass through the central open section 26 of the cover 25.

In an embodiment, a substrate W may be loaded onto, or unloaded from, a substrate table by moving the cover 25 to the open position and passing the substrate W through the central open portion 26 of the cover 25. In the case of loading a substrate W to a substrate table WT, once the substrate W has passed through the open central section 26 of the cover 25, the substrate may be received in the recess 22 of the substrate table WT. Subsequently, the cover 25 may be moved by the actuator system to the closed position, in which it covers the gap 23 between the edge of the substrate W and the edge of the recess 22 in which the substrate W is supported.

The actuator system may be configured such that, in moving the cover 25 to the open position, a plurality of portions of the cover are moved in different respective directions relative to each other. This arrangement may be used in order to enlarge the open central section 26 of the cover 25 in moving to the open position. For example, the actuator system may be configured such that it may move each of the portions of the cover 25 in a respective direction. The respective direction may be away from the open central section 26 when moving the cover to the open position.

In an embodiment, the actuator system may be configured to elastically deform at least a part of the cover 25. For example, the actuator system may elastically deform at least part of the cover 25 when the actuator moves the plurality of portions of the cover 25 in respective different directions in order to enlarge the open central section 26.

Figure 7:
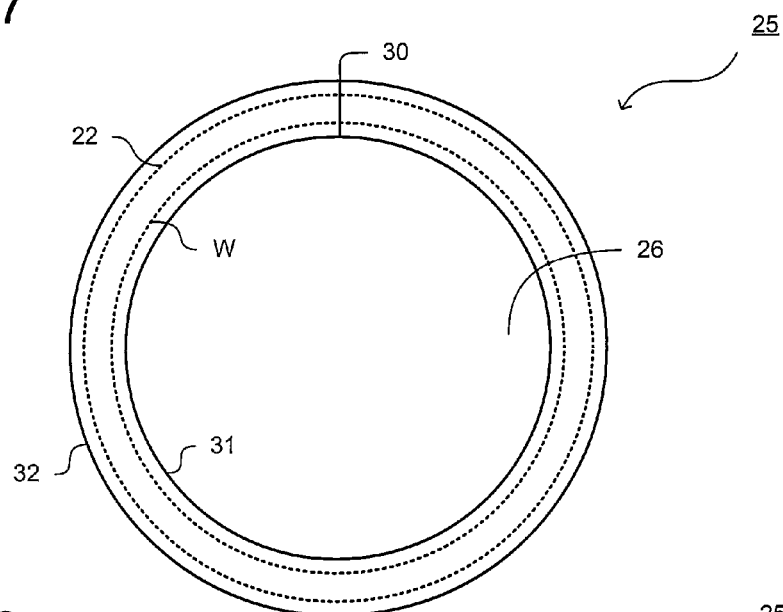
FIGS. 7 and 8 depict, in plan view, a cover according to an aspect of the invention in first and second positions, respectively.
Figure 8:
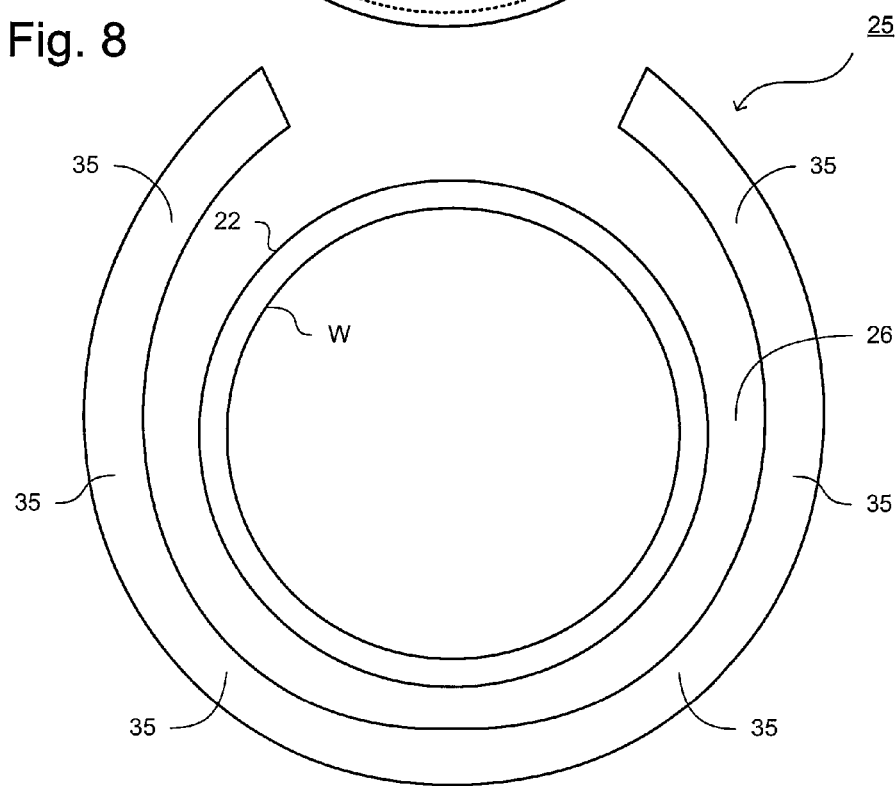

FIGS. 7 and 8 depict, in plan view, a cover 25 according to an embodiment of the invention in the closed and open positions, respectively. As shown, the cover 25 may be generally annular in shape in plan view. The inner periphery 31, e.g. circumference, of the cover 25 may define the open central section 26 of the cover 25 when it is in the closed position. A break 30 in the generally annular shape of the cover 25 may be provided between the inner periphery 31 and the outer periphery 32, e.g., circumference; of the cover 25.

In an arrangement such as that depicted in FIGS. 7 and 8, the cover 25 has a plurality of portions 35 each of which are moveable by the actuator system in respective different directions. In moving the plurality of portions 35 the open central section 26 of the cover 25 may be enlarged or reduced. The plurality of portions may be combined together to form a single integral cover. However, as depicted in FIG. 8, the provision of the break 30 across the periphery, e.g., circumference, of the cover 25 may facilitate the elastic deformation of the cover 25 in order to enlarge the central open section 26.

As depicted in FIG. 8, in the open position, the open central section 26 of the cover 25 may be enlarged such that it is larger than the cross-section of the recess 22 within which the substrate is supported. However, this need not be the case and the open central section 26 need only be sufficiently enlarged for the substrate W to pass through the open central section 26 of the cover 25.

Although the arrangement of FIGS. 7 and 8 includes a break 30 from the inner periphery 31 to the outer periphery 32 of the cover 25, this is not essential. It may be possible to sufficiently elastically deform the cover 25 using the actuator system without the break 30. This may depend on the material from which the cover 25 is formed. It may depend on the extent of the enlargement of the open central section 26 of the cover 25 that is required in order to pass the substrate W through the open central section 26.

Additional breaks may be provided in order to facilitate the enlargement of the open central section 26 of a cover 25 according to this aspect of the invention, for example by elastic deformation of the cover 25.

Including a single break 30 may not sufficiently reduce the instabilities in the meniscus as it crosses the gap. It may reduce the likelihood of the cover not being effective in reducing the flow of immersion liquid into the gap between the edge of the substrate W and the edge 22 of the recess. It may reduce the effectiveness of the cover 25 in reducing the formation of bubbles in the immersion space on crossing the gap. The provision of at least one break 30 may significantly reduce the stresses that may be induced in the cover 25 in order to enlarge the open central section 26. This may increase the lifetime of the cover 25. In addition, this may reduce the actuation forces to move the cover to the open position. This in turn may reduce the requirements of the actuator system and reduce the heat load on the substrate table WT that may be generated by the actuator system.

The provision of any of the covers disclosed herein may have a variety of additional benefits for a substrate table within a lithographic apparatus in addition to the reduction of defects caused by bubbles and/or the reduction of droplets, as described above.

The cleaning of the substrate table WT and the immersion system may be reduced. This, in turn, may reduce the down time of the lithographic apparatus.

A cover may reduce the transfer of contaminants from the upper surface of the substrate W to the lower surface of the substrate W. This may reduce defects that may be introduced as a result of the so-called back side contamination.

The provision of a cover covering the gap between the edge of the substrate W and the edge of the recess 22 may enable the edge of the substrate W to traverse the projection system and immersion system at a higher speed than is otherwise possible. This may increase the throughput of the lithographic apparatus.

The provision of a cover may obviate the need for an extraction system in order to remove immersion liquid and bubbles from the gap between the edge of the substrate W and the edge of the recess 22. This may reduce the heat load applied to the substrate table WT. The thermal stability of the substrate table WT may improve. The overlay accuracy of patterns formed on the substrate W may consequently improve.

An extraction system for the gap between the edge of the substrate W and the edge of the recess 22 may be a two-phase extractor. This type of extractor may produce flow induced vibrations. Therefore, the provision of a cover, which may result in such an extractor being obsolete (not being required), may reduce the vibrations within the substrate table WT.

The provision of a cover may result in a simpler system overall than a system that uses an extractor for the gap between the edge of the substrate W and the edge of the recess 22, as disclosed above. The provision of a cover over the gap 23 may reduce the cost of goods of the apparatus as a whole.

It should be appreciated that the provision of a cover according to an aspect of the invention may eliminate the need for an extraction system at the gap between the edge of the substrate W and the edge of the recess 22, as discussed above. However, a cover according to an aspect of the invention may be used in conjunction with an extraction system. The benefits discussed above may still apply because the requirements of the extraction system may be reduced.

Figure 9:
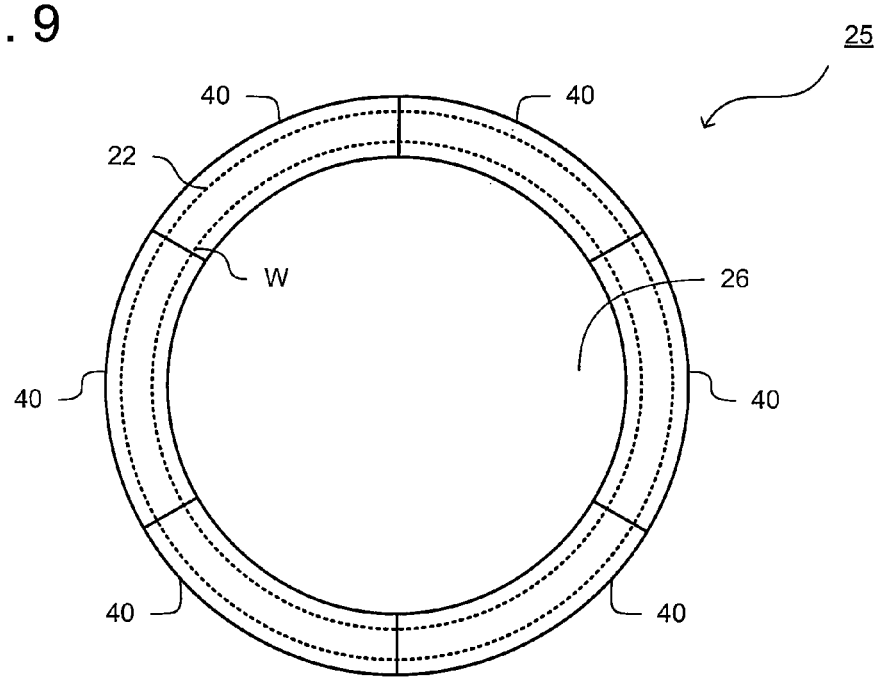
FIGS. 9 and 10 depict, in plan view, a cover according to an aspect of the invention in closed and open positions, respectively.
Figure 10:
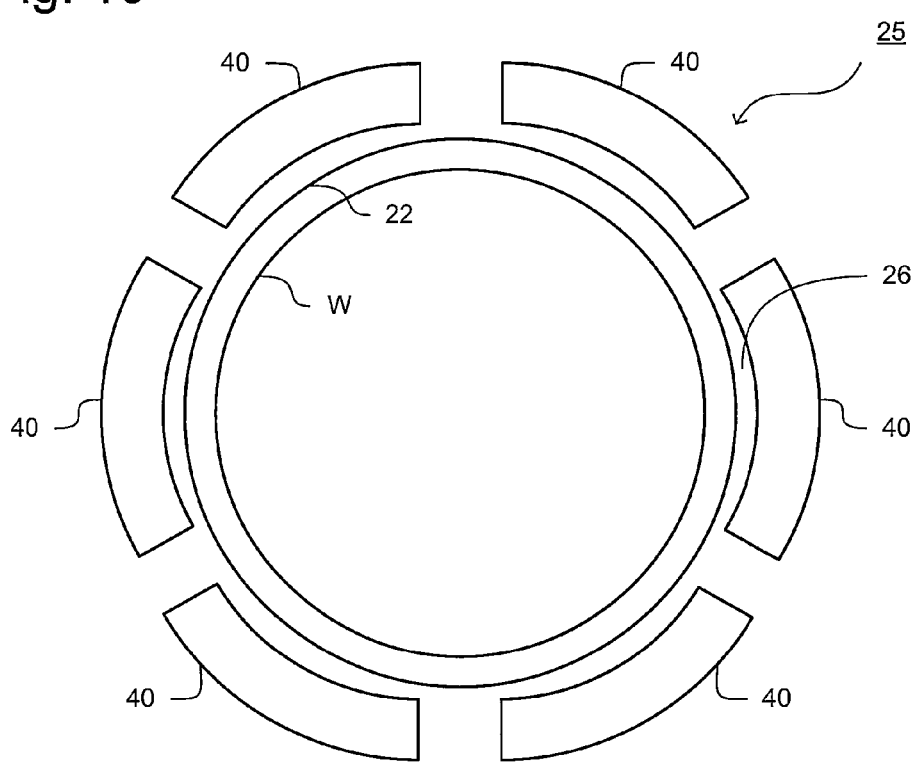

FIGS. 9 and 10 depict, in plan view, an arrangement of a cover 25 according to an embodiment of the invention. The cover depicted in FIGS. 9 and 10 is similar to the cover depicted in FIGS. 7 and 8 and, for brevity, only the differences will be discussed in detail.

As shown, the cover 25 is formed from a plurality of discrete sections 40. In the first position, the sections 40 are arranged to abut adjacent sections 40 of the cover 25 in order to form a single cover 25. For example, as shown in FIG. 9, for a circular substrate W, when each of the discrete sections 40 of the cover 25 abut each other in the first position, the combination of the discrete sections 40 provides a cover 25 having a generally annular shape.

The actuator system is configured such that it can move portions of the cover 25 in different directions in order to move the cover from the closed position to the open position. In the case of a cover 25 such as that depicted in FIGS. 9 and 10, each such portion of the cover 25 is one of the discrete sections 40. The actuator system moves each of the discrete sections 40 of the cover 25 in a respective different direction.

When the cover 25 is in the open position, the discrete sections 40 of the cover 25 may be set apart from each other, providing the enlarged open central section 26 through which the substrate W may pass as described above.

Figure 11:
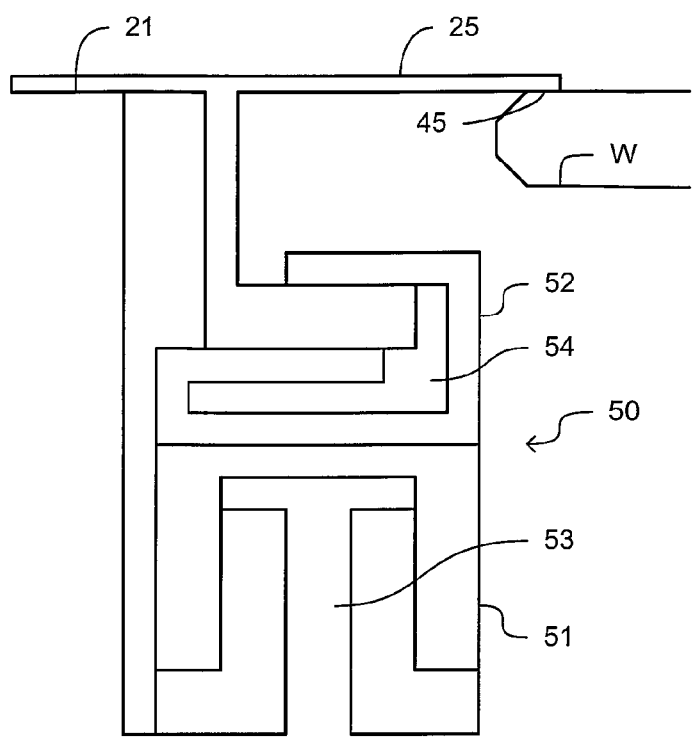
FIGS. 11, 12 and 13 depict, in cross-section, an actuator system for a cover according to an aspect of the invention in, respectively, the closed position, an intermediate position and the open position.
Figure 12:
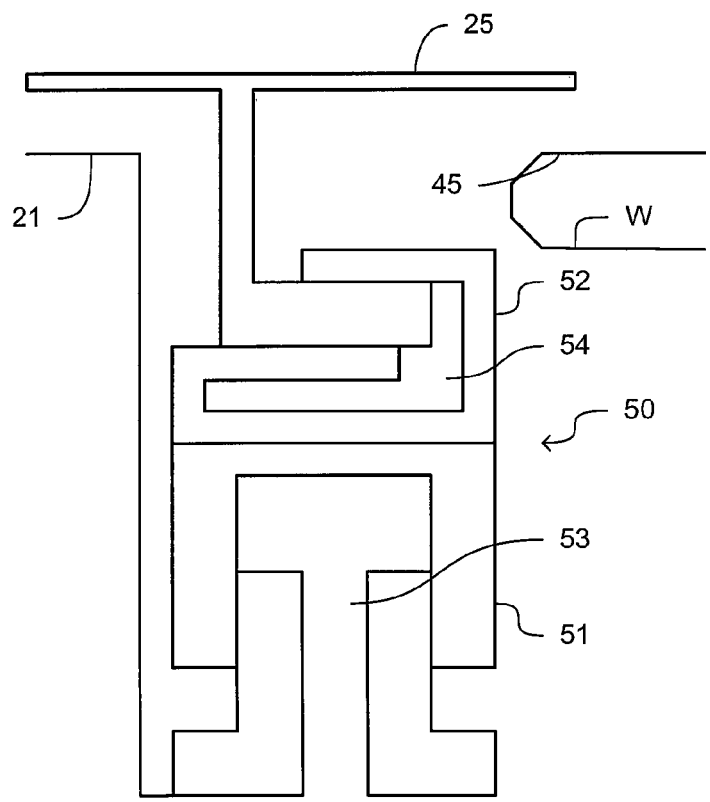
Figure 13:
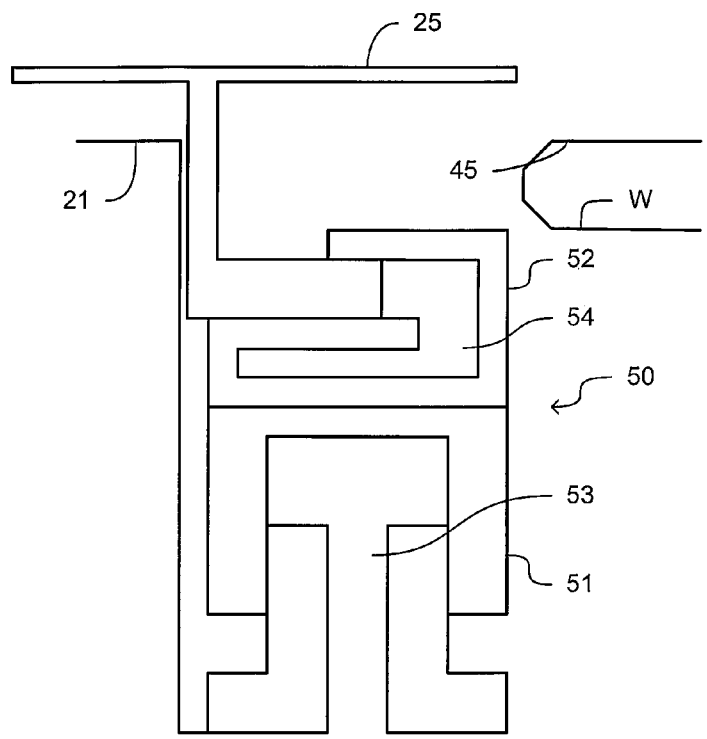

FIGS. 11, 12 and 13 depict, in cross-section, an actuator system that may be used in an aspect of the invention in, respectively, the closed position, an intermediate position and the open position.

As shown FIG. 11, in the closed position, each portion of the cover 25 is positioned on, and extends between, a peripheral portion 45 of the upper surface of the substrate W and the upper surface 21 of the substrate table WT. In moving the cover 25 from the closed position to the open position, the actuator system 50 may be configured such that each portion of the cover 25 is first moved in a direction substantially perpendicular to the upper surface of the substrate W and the upper surface 21 of the substrate table WT.

FIG. 12 depicts a portion of the cover 25 in an intermediate position between the closed and open positions after an initial movement, as described above.

In moving from the open position to the closed position, the cover 25 may be moved to the intermediate position shown in FIG. 12 such that the cover 25 may subsequently be moved to the closed position only by a movement in a direction substantially perpendicular to the upper surface of the substrate W and the upper surface 21 of the substrate table WT.

Such an arrangement may beneficially ensure that, when the cover 25 is in contact with the substrate W or close to the substrate W, the relative movement of the cover 25 to the substrate W is only in a direction that is substantially perpendicular to the upper surface of the substrate W. This may prevent or reduce the generation of contaminant particles at the edge of the substrate W. This may prevent or reduce the movement of pre-existing contaminant particles at the edge of the substrate W towards the upper surface of the substrate W on which a pattern is to be formed. On contacting the substrate by moving the cover in a direction substantially perpendicular to the surface of the substrate W, a force applied to the substrate is applied in a direction substantially perpendicular to the substrate. As the force is applied around the periphery of the substrate, the force applied is substantially uniform. Distortions in the substrate caused by the application of the force are thereby reduced, if not minimized. Forces in the plane of the substrate by application of the cover are reduced, if not minimized, limiting the movement of the substrate in the recess. Position errors by applying the cover to the edge of the substrate may be reduced, if not prevented.

The actuator system 50 may be configured such that it can move each of the portions of the cover 25 between the intermediate position depicted in FIG. 12 and the open position depicted in FIG. 13 by moving each of the portions of the cover 25 in a direction that is substantially parallel to the upper surface of the substrate W and the upper surface 21 of the substrate table WT.

The actuator system 50 may be configured such that, in moving from the closed position to the open position, the cover 25 is first moved away from the upper surface of the substrate W and then moved such that the open central section is enlarged. Likewise, the actuator system 50 may be configured such that moving from the open position to the closed position, the cover 25 is moved such that the open central section 26 is first reduced in size. Then the cover 25 is moved such that it comes into contact with the peripheral region 45 of the upper surface of the substrate W and the upper surface 21.

As shown in FIGS. 11, 12 and 13, the actuator system 50 may include an actuator stage 51 that is configured to provide movement of the cover 25 in a direction substantially perpendicular to the upper surface of the substrate W and the upper surface 21 of the substrate table WT, for example in a vertical direction. The actuator stage 51 may be referred to as a transverse actuator stage.

The actuator system 50 may include an actuator stage 52 configured to provide movement of the cover 25 in a direction substantially parallel to the upper surface of the substrate W and the upper surface 21 of the substrate table WT, for example in a horizontal direction. The actuator stage 52 may be referred to as a lateral actuator stage.

The actuator system 50 may include actuator stages 51, 52 for each of the portions of the cover 25. Alternatively, for example, a single actuator stage 51 may be provided that is common for all of the portions of the cover 25.

The actuator system 50 depicted in FIGS. 11, 12 and 13 is arranged such that the actuator stages 51,52 are provided with a pneumatic actuator. Accordingly, each of the actuator stages 51,52 may be actuated by increasing or decreasing the pressure of a gas within a respective volume 53,54, that is configured to function as a cylinder of a pneumatic actuator, within the actuator stage 51,52. It should be appreciated that actuation of each stage may be positive in each direction by the provision of a gas pressure to a volume that is either greater or less than the ambient gas pressure surrounding the volume.

Alternatively or additionally, each actuator stage 51,52 may be positively actuated in one direction by means of increasing or reducing the gas pressure within a respective volume 53,54 within the actuator stage 51,52. Each actuator stage 51,52 may be returned in the opposite direction by use of a resilient element. In such an arrangement, the resilient element may bias the actuator stage 51,52 to one position. In this case the pneumatic actuator may act against the resilient element in order to move the actuator stage 51,52 to its alternative stationary/stable position.

It will be appreciated that, although the use of pneumatic actuators may be beneficial, alternative actuators may be used for one or both of the actuator stages 51, 52. For example, an electrostatic actuator and/or an electromagnetic actuator and/or a voice coil actuator may be used.

The actuator stage 51 may be configured in order to ensure that substantially the only movement provided is in the direction substantially perpendicular to the upper surface of the substrate W and the upper surface 21 of the substrate table WT. The actuator stage 51 may include one or more movement guides. The one or more movement guides are configured to permit relative movement of the components of the actuator stage 51 in the direction substantially perpendicular to the upper surface of the substrate W and the upper surface 21 of the substrate table. However, the movement guide reduces or minimizes the movement of the component of the actuator stage in a direction substantially parallel to the upper surface of the substrate W and the upper surface 21 of the substrate table.

Figure 14:
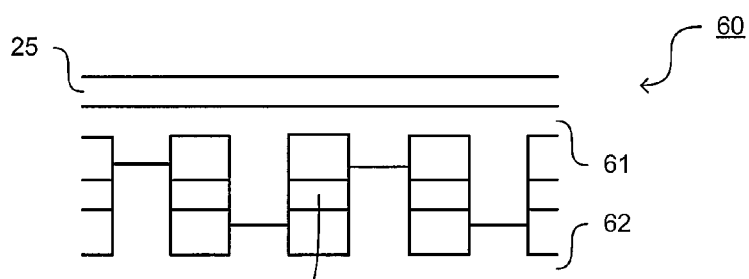
FIGS. 14 and 15 depict, in cross-section, an arrangement of movement guides that may be used in an actuator system of an aspect of the invention.
Figure 15:
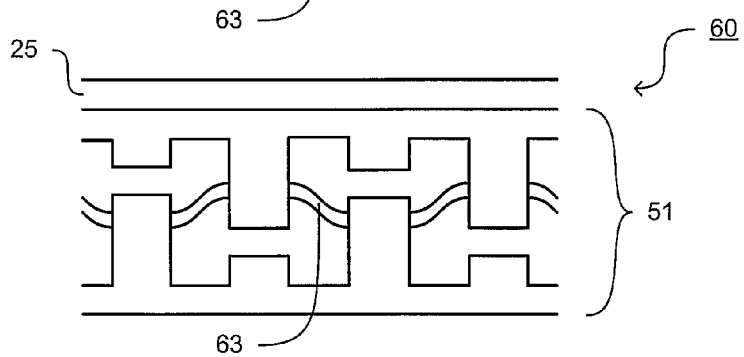

FIGS. 14 and 15 depict, in cross-section, an arrangement of movement guides that may be used in order to help ensure that the actuator stage 51 only provides movement in a particular direction. Such a direction may be a direction substantially perpendicular to the upper surface of the substrate W and the upper surface 21 of the substrate table WT. FIG. 14 depicts a movement guide 60 when the cover 25 is in the closed position. FIG. 15 depicts the movement guide 60 when the cover 25 is in the open position.

As shown, the actuator stage 51 includes first and second components 61,62. The first and second components 61,62 may be moved relative to one another in the direction substantially perpendicular to the upper surface of the substrate W and the upper surface 21 of the substrate table WT by means of the actuator provided as described above. Elastic hinges 63 are provided between the first and second components 61,62 of the actuator stage. The elastic hinges permit movement of the first and second components 61,62 in a direction substantially perpendicular to the upper surface of the substrate W and the upper surface 21 of the substrate table. The elastic hinges are configured to restrict movement in a direction substantially perpendicular to this desired direction of movement.

It will be appreciated that an alternative or additional movement guide may be used. However, the use of one or more such elastic hinges as described above may be beneficial because this form of movement guide does not have, or desirably minimizes, frictional forces. Frictional forces may reduce the reproducibility of the force that is applied on the upper surface of the substrate W when the cover 25 is moved to the closed position.

Figure 16:
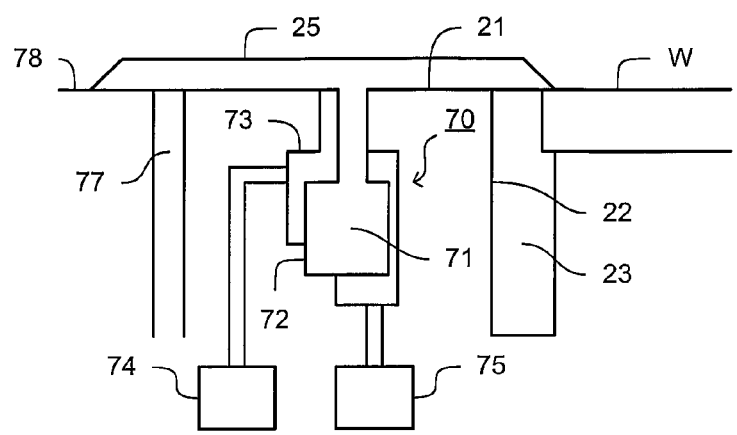
FIGS. 16, 17 and 18 depict an actuator system for a cover according to an aspect of the invention in, respectively, a closed position, an intermediate position and an open position.
Figure 17:
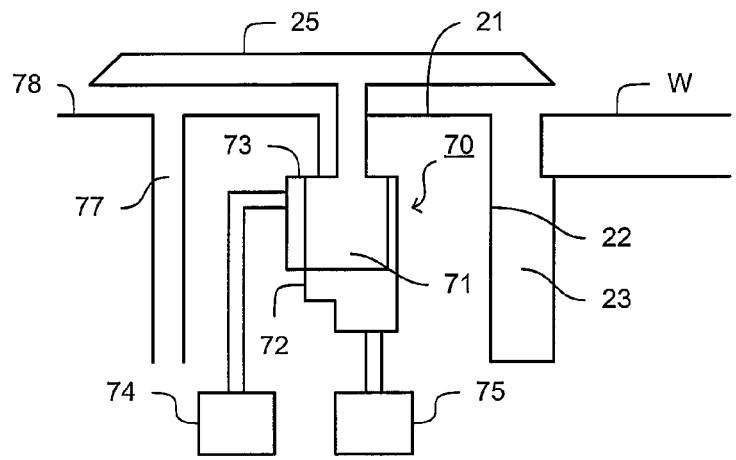
Figure 18:
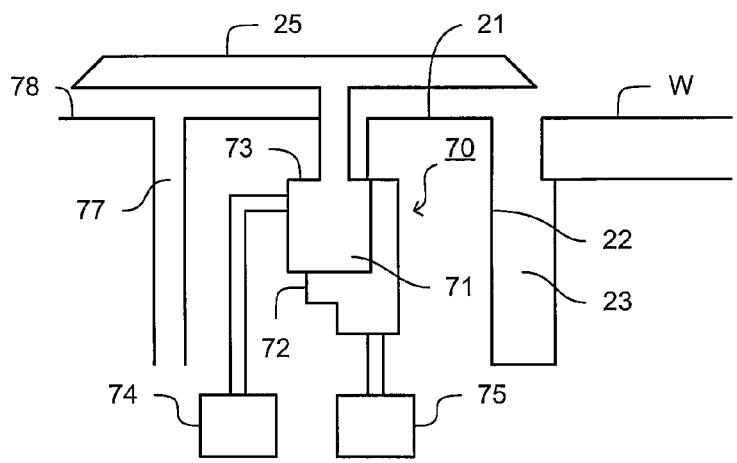

FIGS. 16, 17 and 18 depict a further actuator system that may be used with an aspect of the invention. FIG. 16 depicts the actuator system 70 when the cover 25 is in the closed position. FIG. 17 depicts the actuator system in an intermediate position. FIG. 18 depicts the actuator system 70 when the cover 25 is in the open position.

The actuator system 70 depicted in FIGS. 16, 17 and 18 may provide a simpler actuation system than that depicted in FIGS. 11, 12 and 13. Separate actuator stages are not required. Instead, each portion of the cover 25 is connected to a piston 71 that is mounted within a system of movement guides 72,73 within the substrate table WT.

A movement guide 72 may, in cooperation with the piston 71, be used to move the cover 25 from the closed position in a direction substantially perpendicular to the upper surface of the substrate W and the upper surface 21 of the substrate table WT to the intermediate position. A movement guide 73 may be arranged such that, in conjunction with the piston 71, it moves the cover 25 in a direction substantially parallel to the upper surface of the substrate W and the upper surface 21 of the substrate table WT. In order to move the cover 25 between the closed and open positions, the gas pressure on one or both sides of the piston 71 may be changed by connecting one or both of the movement guides 72,73 to an appropriate under-pressure or over-pressure source 74,75.

FIGS. 16, 17 and 18 depict an aspect of the invention that may be applied to any of the arrangements for providing a cover described within this application. The cover 25 may be configured such that in the closed position it not only covers the gap 23 between the edge of the substrate W and the edge of the recess 22 in the substrate table but it covers a further gap 77. For example, an additional gap may exist between the actuator system and a part of the substrate table further away from the substrate holder such as an additional component 78. The additional component 78 may be a component of a sensor system used in order to monitor the position and/or displacement of the substrate table WT relative to the projection system.

As depicted in FIG. 19, an opening 80 may be formed in the surface of the recess. The opening may be a gas outlet which is connected to an under-pressure source 81. This gas outlet may be arranged such that the pressure on a lower side 25a of the cover 25 is lower than the pressure on an upper side 25b. Operation of the gas outlet may help ensure that, in the closed position, the cover 25 is secured to the peripheral area 45 of the upper surface of the substrate W.

As depicted in FIG. 19, the recess 22 in the substrate table WT may be provided with a secondary cover 85 that extends from an edge of the recess. The secondary cover 85 is configured such that, when a substrate is within the recess, a peripheral area 86 of the lower surface of the substrate W is in contact with the secondary cover 85. A secondary cover 85 may beneficially further reduce the transfer of any immersion liquid from the upper surface of the substrate W to the lower surface of the substrate W. It will be appreciated that if, for example, a circular substrate W is used, the secondary cover may be generally annular in shape. The secondary cover 85 may have the same thickness as the cover 25. It may be thicker than the cover 25. In general, the secondary cover may be between 10 microns and 100 microns.

As shown in FIG. 19, when a substrate W is in the recess and the cover 25 is in the closed position, the cover 25, the edge of the recess 22, the edge of the substrate W and the secondary cover 85 may define an enclosed space 87. The secondary cover may have an external side 85a which is external to the enclosed space and an internal side 85b which is internal to the enclosed space. The external side 85a of the secondary cover 85 may be opposite the internal side 85b of the secondary cover 85 that adjoins the enclosed space 87. The enclosed space 87 may be connected to a gas outlet 80, which in turn is connected to an under-pressure source 81. The pressure in the enclosed space 87 may be less than the pressure on the external side 85a.

In such an arrangement, the secondary cover 85 may apply a force to the peripheral area 86 of the lower surface of the substrate W. In an appropriate arrangement of the cover 25 and the secondary cover 85, the forces applied to the substrate W by the cover 25 and the secondary cover 85 may be equal but in opposite directions. In such an arrangement, the net force on the periphery, of the substrate W may be zero or minimized, reducing deformation of the substrate W.

FIGS. 20 and 21 depict, in cross-section, an embodiment of the invention in which a different arrangement of cover 125 is provided to cover the gap 23 between the edge of the substrate W and the edge of the recess 22 in the substrate table WT in which the substrate W is supported.

In common with the arrangements discussed above, the cover 125 is arranged in the form of a thin plate of material that surrounds the edge of the substrate W. The cover 125 extends from a peripheral area 45 of the upper surface of the substrate W to the upper surface 21 of the substrate receiving section. Openings 127 for gas outlets may be provided that are connected to an under-pressure source 128. The pressure in a space on the lower side 125a of the cover 125 may be lower than the gas pressure on the upper side 125b of the cover 125. The pressure difference may be used in order to secure the cover 125 and substantially prevent any movement of the cover 125 during use.

In order to prevent or reduce deformation of the cover 125, the cover may include one or more supports 126 that extend from the lower surface 125a of the cover 125 to the bottom of the recess 22 when the cover 125 is located on top of a substrate W in the recess 22.

In order to move the cover 125 in order to permit loading and unloading of a substrate W, a cover handling system 130 such as a robot arm may be provided. Specifically, the handling system may be provided within the same compartment of a lithographic apparatus as the substrate table WT and may be configured to remove the cover 125 from the substrate table WT in order to permit loading and unloading of the substrate W. The cover handling system 130 may be specifically configured such that the movement of the cover 125 when the cover 125 is in contact with the substrate W or close to the substrate W is only in a direction that is substantially perpendicular to the upper surface of the substrate W and the upper surface 21 of the substrate table WT.

Figure 22:
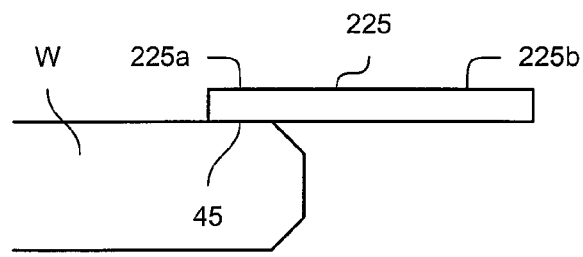
FIGS. 22 and 23 depict, in cross-section, an arrangement of a cover according to an aspect of the invention.
Figure 23:
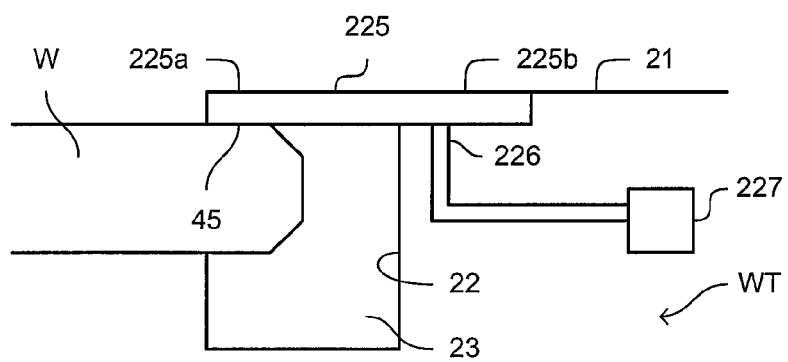

FIGS. 22 and 23 depict a further aspect of the invention. As shown, in this arrangement, before a substrate W is loaded to a substrate table WT, a cover 225 is attached to the peripheral area 45 of the upper surface of the substrate W. As shown, a first portion 225a of the cover 225 is attached to the substrate W and a second, overhang portion 225b of the cover 225 extends beyond the edge of the substrate W.

The cover 225 may be formed from any suitable material. As discussed above, it may be coated with, for example, Lipocer. This may help ensure that the cover 225 remains sufficiently lyophobic, e.g. hydrophobic for water, during exposure of the substrate. It may be attached to the substrate W, for example, by means of an appropriate adhesive or by capillary action.

As shown in FIG. 23, when the substrate W is loaded to the substrate table WT, the overhang portion 225b of the cover 225 extends across the gap 23 between the edge of the recess 22 in the substrate table WT in which the substrate in supported and the edge of the substrate W. When the substrate W is loaded onto the substrate table WT, the overhang portion 225b comes into contact with the upper surface 21 of the substrate table WT. In order to secure the overhang portion 225b to the upper surface 21 of the substrate table WT, one or more openings 226 configured to operates as gas outlets may be provided in the upper surface 21 of the substrate table WT. The one or more openings may be connected to an underpressure source 227.

Figure 24:
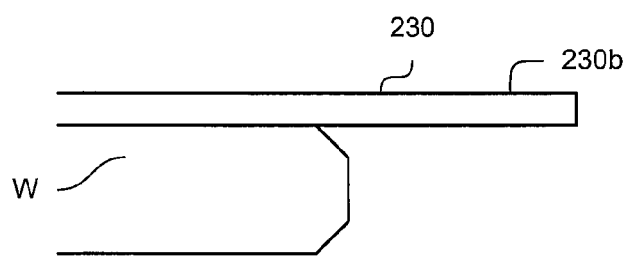
FIG. 24 depicts, in cross-section, a variation of the aspect of the invention depicted in FIGS. 22 and 23.

As depicted in FIG. 24, the arrangement depicted in FIGS. 22 and 23 may be modified by applying a spin coated surface 230 onto the upper surface of the substrate W in place of the cover 225. The spin coated surface may include an over-hang portion 230b that may be used in the same fashion as the overhang portion 225b of the cover 225 depicted in FIGS. 22 and 23. A benefit of the use of a spin coated layer 230 may be that there is no step in height on the upper surface of the substrate W as a result of the provision of the layer with the overhang portion. After exposure, the spin coated layer may be removed from the substrate W with a rinse process.

Figure 25:
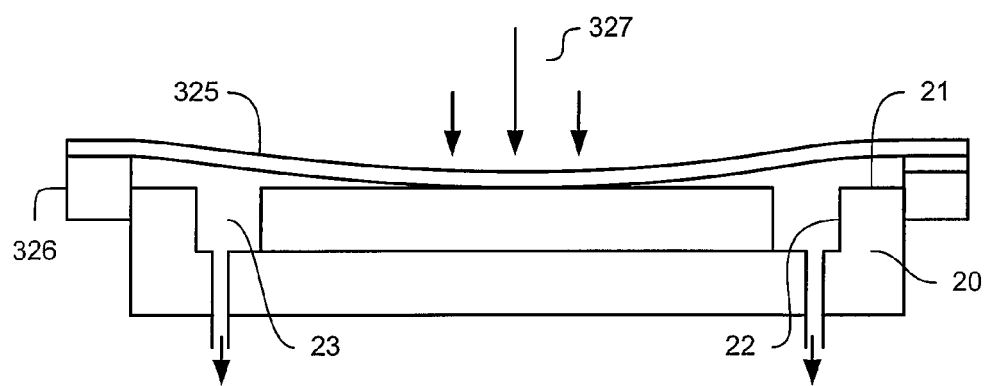
FIGS. 25 and 26 depict, in cross-section, a cover according to an aspect of the invention.
Figure 26:
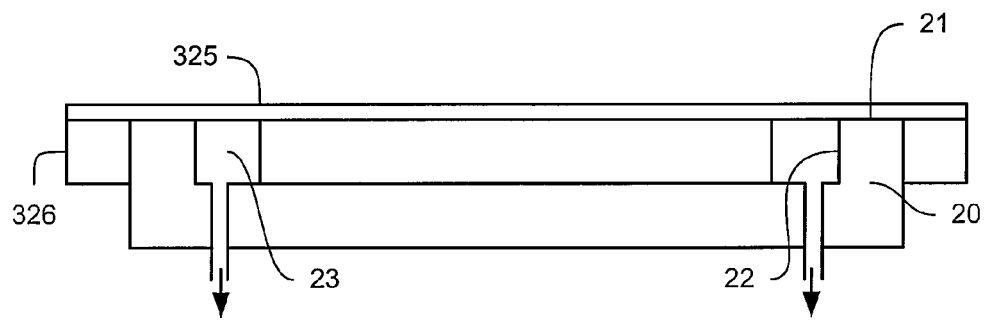

FIGS. 25 and 26 depict, in cross-section, an embodiment of the invention. As shown in FIG. 26, after a substrate W is loaded to the recess 22 of a substrate table WT, a very thin cover 325 is applied across the entire upper surface of the substrate W and the upper surface 21 of the substrate table WT of the substrate table WT. The cover 325 may be transparent to the radiation that is to be used to transfer a pattern to the surface of the substrate W. Accordingly, the cover 325 will cover the gap 23 between the edge of the recess 22 and the edge of the substrate W.

As shown, in FIG. 25, the cover 25 may be supported by a foil frame 326 that is used in order to apply the cover 325 to the substrate W and the upper surface 21 of the substrate table WT. The cover 325, supported by the foil frame 326, may be lowered towards the top surface of the substrate W. At the same time, a gas flow 327 may be provided to the center of the cover 325 until the center of the cover 325 makes contact with the upper surface of the substrate W. Subsequently, the gas flow applied to the top surface of the cover 325 may be gradually moved towards the edge of the substrate W and the upper surface 21 of the substrate table WT. Simultaneously the foil frame 326 may be lowered. If necessary, gas may be extracted from the space below the cover 325. After the cover 325 is fully applied to the substrate W, a continuous surface with substantially no gaps may be provided across the entirety of the substrate W and the substrate table WT.

In an aspect, there is provided a substrate table for a lithographic apparatus, the substrate table having a substantially planar upper surface in which is formed a recess that is configured to receive and support a substrate, the substrate table comprising a cover, configured such that, in use, it extends around the substrate from the upper surface to a peripheral section of an upper major face of the substrate in order to cover a gap between an edge of the recess and an edge of the substrate and such that it defines an open central section of the cover, and an actuator system configured to move the cover between a closed position, in which the cover is in contact with the upper surface of a substrate supported in the recess, and an open position, in which the cover is set apart from a substrate in the recess, wherein the actuator system is configured such that, in moving the cover to the open position, it enlarges the open central section of the cover sufficiently for the substrate to be able to pass through the open central section of the cover.

In an embodiment, the actuator system is configured such that, in moving the cover to the open position, a plurality of portions of the cover move in different respective directions relative to each other in order to enlarge the open central section of the cover.

In an embodiment, the actuator system is configured such that, in moving the cover to the open position, it moves each of the portions of the cover in a respective direction that is away from the open central section of the cover.

In an embodiment, the cover comprises a generally annular-shaped plate of material, comprising a break from its inner periphery to its outer periphery at a location around its periphery.

In an embodiment, the actuator system and the cover are configured such that, when moving a plurality of portions of the cover in respective different directions in order to move the cover to the open position, at least part of the cover is elastically deformed.

In an embodiment, the cover is configured such that each portion of the cover comprises a discrete section of the cover and the actuator system is configured such that it can move each of the sections of cover in a respective different direction.

In an embodiment, when the cover is in the closed position, each of the sections of the cover abut adjacent sections in order to form a single cover, and, when the cover is in the open position, the sections of the cover are set apart from each other.

In an embodiment, the actuator system includes a transverse movement actuator stage configured to move each of a plurality of portions of the cover in a direction substantially perpendicular to the upper surface of the substrate table and a lateral movement actuator stage configured to move each of the plurality of portions of the cover in respective directions substantially parallel to the upper surface of the substrate table.

In an embodiment, the lateral movement actuator stage and/or the transverse movement actuator stage comprises (i) a pneumatic actuator, or (ii) an electrostatic actuator, or (iii) a voice coil actuator, or (iv) any combination selected from (i)-(iii).

In an embodiment, the actuator system is configured such that, as the cover approaches the closed position, the transverse movement actuator stage moves each of the portions of the cover in the direction substantially perpendicular to the upper surface of the substrate table.

In an embodiment, the transverse movement actuator stage comprises first and second components, an actuator configured to move the second component relative to the first component in the direction substantially perpendicular to the upper surface of the substrate table, and at least one movement guide, wherein the at least one movement guide is configured to minimize movement of the first component relative to the second component in a direction substantially parallel to the upper surface of the substrate table.

In an embodiment, the at least one movement guide is configured to be substantially frictionless.

In an embodiment, the substrate table further comprises a gas outlet configured to be connected to an under-pressure source such that, in use, the pressure on a first side of the cover that adjoins the gap covered by the cover is lower than the pressure on a second side of the cover, opposite the first side.

In an embodiment, the recess in the upper surface of the substrate table comprises a secondary cover, extending from the edge of the recess and configured such that, when a substrate is supported by the substrate's lower major face in the recess, the secondary cover is in contact with the periphery of the lower major face of the substrate.

In an embodiment, the secondary cover is generally annular in shape.

In an embodiment, when a substrate is supported by the substrate's lower major face in the recess, an enclosed space is defined by the edge of the recess, the edge of the substrate, the cover and the secondary cover, and the substrate table further comprises a gas outlet configured to be connected to an under-pressure source such that, in use, the pressure on the side of the secondary cover that adjoins the enclosed space is less than the pressure on the opposite side of the secondary cover that faces away from the enclosed space.

In an embodiment, the substrate table comprises at least one further component arranged to be adjacent to the substrate table and having an upper surface that is substantially parallel to the upper surface of the substrate table, and the cover is configured such that, when it is in the closed position, it also covers a gap between an edge in the surface of the substrate table and an edge of the at least one further component at the point at which the at least one further component neighbors the recess.

In an aspect, there is provided a lithographic apparatus, comprising a substrate table as mentioned above.

In an aspect, there is provided a method of loading a substrate onto, or unloading a substrate from, a substrate table of a lithographic apparatus comprising a substrate table, having a substantially planar upper surface and a recess within the upper surface that is configured to receive and support the substrate, and a cover, configured such that, in use, it extends around the substrate from the upper surface of the substrate table to a peripheral section of an upper major face of the substrate in order to cover a gap between an edge of the recess and an edge of the substrate and such that it defines an open central section of the cover, wherein the method comprises moving the cover between a closed position, in which the cover is in contact with the upper surface of the substrate supported in the recess, and an open position, in which the cover is set apart from the substrate in the recess, and wherein, in moving the cover to the open position, the open central section of the cover is enlarged sufficiently for the substrate to pass through the open central section of the cover.

In an embodiment, when the cover is moved to or from the closed position, the cover is moved relative to the substrate table in a direction substantially perpendicular to the upper surface of the substrate table.

In an aspect, there is provided a method of loading a substrate onto a substrate table of a lithographic apparatus, the method comprising placing a substrate in a recess formed in an upper surface of a substrate table, the recess configured to receive a substrate, and moving a cover to a closed position, in which the cover is in contact with the upper surface of the substrate supported in the recess, from an open position, in which the cover is set apart from the substrate, the cover configured such that, when a substrate is present in the recess, in the closed position the cover extends around the substrate, from the upper surface of the substrate table to a peripheral section of an upper surface of the substrate, the cover having an open central section.

In an aspect, there is provided a method of unloading a substrate from a substrate table of a lithographic apparatus, the method comprising moving a cover: from a closed position, in which the cover is in contact with an upper surface of a substrate supported in a recess formed in an upper surface of a substrate table, the cover configured such it extends around the substrate from the upper surface of the substrate table to a peripheral section of an upper major face of the substrate, the cover defining an open central portion, to an open position, in which the cover is set apart from the substrate, so that the open central portion of the cover is enlarged sufficiently for the substrate to pass through the open central section, and removing the substrate from the substrate table.

In an aspect, there is provided a device manufacturing method, comprising the method of loading a substrate onto and/or unloading a substrate from a lithographic apparatus as mentioned above.

In an aspect, there is provided a substrate table for a lithographic apparatus, the substrate table configured to support a substrate in a recess formed in a planar surface of the substrate table, the recess dimensioned to have a gap between a substrate supported by the substrate table and an edge of the recess, the substrate table having a closing arrangement configured to close the gap, the arrangement comprising a planar closing element shaped and dimensioned to close the gap between an edge of a substrate and the edge of the recess, and an actuator configured to move the planar closing element from an open position in which a substrate can be placed in the recess and a closed position in which the planar closing element closes the gap, wherein in moving the closing element into the closed position, the actuator is configured to move the closing element in a direction substantially perpendicular to the surface of the substrate to close the gap.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

To operate one or more movements of a component of an embodiment of the invention, such as an actuator, there may be one or more controllers. The controllers may have any suitable configuration to receive, process, and send signals. For example, each controller may include one or more processors to execute a computer program that includes machine-readable instructions to cause performance of the methods described above. The controllers may include data storage medium to store such computer program, and/or hardware to receive such a medium.

While specific embodiments of the invention have been described above, it will be appreciated that the invention may be practiced otherwise than as explicitly described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. The computer programs may be suitable for controlling a controller referred to herein.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate, table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. A substrate table for a lithographic apparatus, the substrate table comprising:
   a substrate table part having a substantially planar upper surface in which there is a recess that is configured to receive a substrate, the recess having a cross-sectional width;
   a cover, configured such that, in use, it extends around the substrate from the upper surface of the substrate table part to a peripheral section of an upper major face of the substrate in order to cover a gap between an edge of the recess and an edge of the substrate and such that it defines an open central section of the cover, wherein the cover has a cross-sectional width larger than the cross-sectional width of the recess; and
   an actuator system, in or on the substrate table, configured to move the cover between a closed position, in which the cover is in contact with the upper surface of a substrate supported in the recess and in contact with and on top of the upper surface of the substrate table part and the open central section is smaller than the upper surface of the substrate, and an open position, in which the cover is displaced vertically from and above a substrate in the recess and displaced vertically from and above the upper surface of the substrate table part, wherein the actuator system is configured such that, in moving the cover to the open position, at least part of the actuator system moves between the substrate supported in the recess and at least part of the upper surface of the substrate table part and the actuator system enlarges the open central section of the cover sufficiently for the substrate to be able to pass through the open central section of the cover.

2. The substrate table of claim 1, wherein the actuator system is configured such that, in moving the cover to the open position, a plurality of portions of the cover move in different respective directions relative to each other in order to enlarge the open central section of the cover.

3. The substrate table of claim 2, wherein the actuator system is configured such that, in moving the cover to the open position, it moves each of the portions of the cover in a respective direction that is away from the open central section of the cover.

4. The substrate table of claim 2, wherein the cover is configured such that each portion of the cover comprises a discrete section of the cover and the actuator system is configured such that it can move each of the sections of cover in a respective different direction.

5. The substrate table of claim 4, wherein, when the cover is in the closed position, each of the sections of the cover abut adjacent sections in order to form a single cover, and, when the cover is in the open position, the sections of the cover are set apart from each other.

6. The substrate table of claim 1, wherein the cover comprises a generally annular-shaped plate of material, comprising a break from its inner periphery to its outer periphery at a location around its periphery.

7. The substrate table of claim 1, wherein the actuator system and the cover are configured such that, when moving a plurality of portions of the cover in respective different directions in order to move the cover to the open position, at least part of the cover is elastically deformed.

8. The substrate table of claim 1, wherein the actuator system includes a transverse movement actuator stage configured to move each of a plurality of portions of the cover in a direction substantially perpendicular to the upper surface of the substrate table and a lateral movement actuator stage configured to move each of the plurality of portions of the cover in respective directions substantially parallel to the upper surface of the substrate table.

9. The substrate table of claim 8, wherein the lateral movement actuator stage and/or the transverse movement actuator stage comprises (i) a pneumatic actuator, or (ii) an electrostatic actuator, or (iii) a voice coil actuator, or (iv) any combination selected from (i)-(iii).

10. The substrate table of claim 8, wherein the actuator system is configured such that, as the cover approaches the closed position, the transverse movement actuator stage moves each of the portions of the cover in the direction substantially perpendicular to the upper surface of the substrate table.

11. The substrate table of claim 8, wherein the transverse movement actuator stage comprises:
   first and second components,
   an actuator configured to move the second component relative to the first component in the direction substantially perpendicular to the upper surface of the substrate table, and
   at least one movement guide, wherein the at least one movement guide is configured to minimize movement of the first component relative to the second component in a direction substantially parallel to the upper surface of the substrate table.

12. The substrate table of claim 11, wherein the at least one movement guide is configured to be substantially frictionless.

13. The substrate table of claim 1, further comprising a gas outlet configured to be connected to an under-pressure source such that, in use, the pressure on a first side of the cover that adjoins the gap covered by the cover is lower than the pressure on a second side of the cover, opposite the first side.

14. The substrate table of claim 1, wherein the recess in the upper surface of the substrate table comprises a secondary cover, extending from the edge of the recess and configured such that, when a substrate is supported by the substrate's lower major face in the recess, the secondary cover is in contact with the periphery of the lower major face of the substrate.

15. The substrate table of claim 14, wherein the secondary cover is generally annular in shape.

16. The substrate table of claim 14, wherein, when a substrate is supported by the substrate's lower major face in the recess, an enclosed space is defined by the edge of the recess, the edge of the substrate, the cover and the secondary cover; and the substrate table further comprises a gas outlet configured to be connected to an under-pressure source such that, in use, the pressure on the side of the secondary cover that adjoins the enclosed space is less than the pressure on the opposite side of the secondary cover that faces away from the enclosed space.

17. The substrate table of claim 1, wherein the substrate table comprises at least one further component arranged to be adjacent to the substrate table and having an upper surface that is substantially parallel to the upper surface of the substrate table; and
   the cover is configured such that, when it is in the closed position, it also covers a gap between an edge in the surface of the substrate table and an edge of the at least one further component at the point at which the at least one further component neighbors the recess.

18. A substrate table for a lithographic apparatus, the substrate table configured to support a substrate in a recess, the substrate table comprising:
   a substrate table part having a substantially planar upper surface in which there is the recess, the recess dimensioned to have a gap between a substrate supported by the substrate table and an edge of the recess, the recess having a cross-sectional width;
   a closing element shaped and dimensioned to close the gap between an edge of a substrate and the edge of the recess, the closing element having a cross-sectional width larger than the cross-sectional width of the recess; and
   an actuator, in or on the substrate table, configured to move the closing element between an open position in which a substrate can be placed in the recess and a closed position in which the closing element closes the gap, wherein, in moving the closing element between the open and closed position, at least part of the actuator moves between the substrate supported in the recess and at least part of the upper surface of the substrate table part,
   wherein in moving the closing element into or out of the closed position, the actuator is configured to move the closing element in a direction substantially only perpendicular to the surface of the substrate when the closing element contacts the edge of the substrate and on top of the planar surface of the substrate table, to close or open the gap.

19. A method of loading a substrate onto, or unloading a substrate from, a substrate table of a lithographic apparatus, the substrate table, comprising a substrate table part having a substantially planar upper surface and a recess within the upper surface that is configured to receive the substrate, the recess having a cross-sectional width, the method comprising:
   using an actuator system, moving a cover between a closed position, in which the cover is in contact with the upper surface of the substrate supported in the recess and in contact with and on top of the upper surface of the substrate table part and the open central section is smaller than the upper surface of the substrate, the cover configured such that it extends around the substrate from the upper surface of the substrate table part to a peripheral section of the upper surface of the substrate, the cover defining an open central portion and the cover having a cross-sectional width larger than the cross-sectional width of the recess, and an open position, in which the cover is displaced vertically set apart from and above the substrate in the recess and displaced vertically from and above the upper surface of the substrate table part, wherein, in moving the cover to the open position, at least part of the actuator system moves between the substrate supported in the recess and at least part of the upper surface of the substrate table part and the open central section of the cover is enlarged sufficiently for the substrate to pass through the open central section of the cover.

20. A method of loading a substrate onto, or unloading a substrate from, a substrate table of a lithographic apparatus, the substrate table having a substantially planar upper surface in which there is recess to receive and support a substrate, the method comprising:

moving a cover:
- between a closed position, in which the cover is in contact with and on top of an upper surface of a substrate supported in the recess and in contact with and on top of the upper surface of the substrate table, the cover configured such that it extends from the upper surface of the substrate table to a peripheral section of an upper major face of the substrate; and
- an open position, in which the cover is set apart from the substrate and from the upper surface of the substrate table, by moving at least part of an actuator for the cover through an opening in the upper surface of the substrate table, wherein at least part of the upper surface of the substrate table is located between the substrate supported in the recess and the opening; and removing the substrate from, or placing the substrate on, the substrate table.

21. A substrate table for a lithographic apparatus, the substrate table having a substantially planar upper surface in which is formed a recess that is configured to receive and support a substrate, the substrate table comprising:

- a cover, configured such that, in use, it extends from the upper surface to a peripheral section of an upper major face of the substrate in order to cover a gap between an edge of the recess and an edge of the substrate; and
- an actuator system, in or on the substrate table, configured to move the cover between a closed position, in which the cover is in contact with the upper surface of a substrate supported in the recess and in contact with and on top of the upper surface of the substrate table, and an open position, in which the cover is set apart from a substrate in the recess and from the upper surface of the substrate table, wherein at least part of the upper surface of the substrate table is located between the substrate supported in the recess and an opening in the upper surface of the substrate table through which at least part of the actuator system moves.

* * * * *